SEMICONDUCTOR WITH MULTI-REGIONS OF ONE CONDUCTIVITY-TYPE AND A COMMON REGION OF OPPOSITE CONDUCTIVITY-TYPE FORMING DISTRICT TUNNEL-DIODE JUNCTIONS

Filed Feb. 8, 1960 2 Sheets-Sheet 1

INVENTOR.
CHIH-TANG SAH
BY
Lippincott, Ralls & Hendricson
ATTORNEYS

Dec. 17, 1963 CHIH-TANG SAH 3,114,864

SEMICONDUCTOR WITH MULTI-REGIONS OF ONE CONDUCTIVITY-TYPE AND A COMMON REGION OF OPPOSITE CONDUCTIVITY-TYPE FORMING DISTRICT TUNNEL-DIODE JUNCTIONS

Filed Feb. 8, 1960 2 Sheets-Sheet 2

INVENTOR.
CHIH-TANG SAH
BY
Lippincott, Ralls & Hendricson
ATTORNEYS 3,114,864

SEMICONDUCTOR WITH MULTI-REGIONS OF ONE CONDUCTIVITY-TYPE AND A COMMON REGION OF OPPOSITE CONDUCTIVITY-TYPE FORMING DISTRICT TUNNEL-DIODE JUNCTIONS

Chih-Tang Sah, Berkeley, Calif., assignor, by mesne assignments, to Fairchild Camera and Instrument Corporation, Syosset, N.Y., a corporation of Delaware Filed Feb. 8, 1960, Ser. No. 7,228
3 Claims. (Cl. 317—234)

This invention relates to semiconductor devices containing p-n junctions having tunnel-diode characteristics.

It is known that abrupt junctions between heavily doped, p and n regions in a semiconductor have an unusual voltage-current characteristic, including a region of voltage-controlled, negative resistance, caused by quantum-mechanical tunneling of carriers through the junction. For example, see L. Esaki, "New Phenomenon in Narrow Be p-n Junctions," Phys. Rev., vol. 109, 1958, and H. S. Sommers, Jr., "Tunnel Diodes as High-Frequency Devices," Proc. IRE, vol. 47, 1959. This characteristic is herein referred to as the tunnel-diode characteristic, and the chief object of this invention is the fabrication of improved two-terminal and three-terminal semiconductor devices containing junctions having tunnel-diode characteristics.

A considerable problem in the design and fabrication of tunnel diodes is to achieve a reasonably high impedance. One way to increase the impedance is to reduce the area of the junction—the two being inversely related—but in conventional configurations this also reduces the contact areas available for the attachment of leads, and may lead to dimensions so small that fabrication is difficult, even with photoengraving techniques and the like. Hence, a more specific object of this invention is to provide p-n junctions of small area relative to the contact area.

Another object is to provide a novel, three-terminal semiconductor device containing a p-n junction having tunnel-diode characteristics.

Still another object is to provide tunnel-effect devices capable of use as oscillators at higher frequencies and as amplifiers having a greater power gain-band width product than has been attainable heretofore.

The foregoing and other aspects of the invention will be better understood from the illustrative description that follows and the accompanying drawings.

FIG. 1 of the drawings is a greatly enlarged plan view, not to exact scale, of a tunnel diode embodying this invention;

Figure 1:
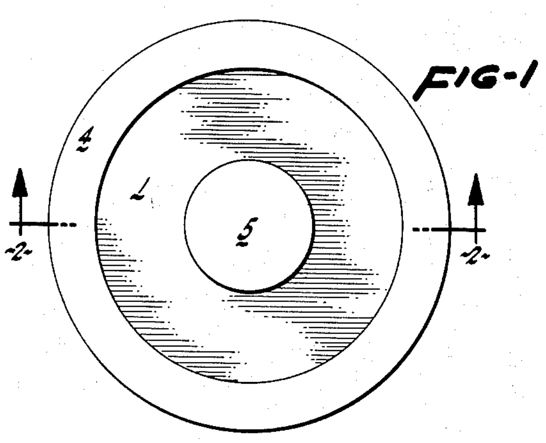
Figure 2:
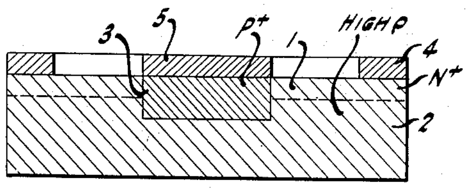
FIG. 2 is a section taken along line 2—2 of FIG. 1.

Referring to FIGS. 1 and 2, the tunnel diode illustrated consists essentially of a monocrystalline body of semiconductor, e.g., silicon, containing a thin, heavily doped, surface layer 1 overlying a region 2 of high resistivity (intrinsic or nearly intrinsic) semiconductor, and a heavily doped island 3, extending through the surface layer 1 into the high-resistivity region 2. Surface layer 1 and island 3 are of opposite conductivity types, e.g., n+ and p+, respectively, the + marks indicating heavy doping (high concentration of donor or acceptor impurities) sufficient to form a junction having tunnel-diode characteristics. Region 2 may be of either conductivity type, or perfectly intrinsic—because of its high resistivity (high $\rho$) it conducts relatively little tunnel current in either case.

Connection is made to layer 1 by means of an ohmic contact 4, which preferably takes the form of an annular, metal-film electrode concentrically surrounding island 3. Contact to island 3 is a metal-alloy disc or button 5, the formation of island 3 preferably being accomplished by the alloying of button 5 to the monocrystalline semiconductor, as hereinafter described. The junction between heavily doped p+ island 3 and heavily doped n+ layer 1 has the voltage-current characteristic heretofore known to be associated with tunnel diodes and believed to be caused by quantum-mechanical tunneling of current carriers through the junction. This characteristic includes a highly significant, negative-resistance region at a forward bias of a few hundred millivolts.

In prior tunnel diodes, the small operating voltages and the relatively high current densities have yielded devices having an impedance that is inconveniently small for many applications. In the present diodes, a higher impedance is obtained by making the junction area exceptionally small in relation to the contacts and other parts, which must be of appreciable size for easy fabrication and mechanical strength. The junction between island 3 and surface layer 1 is ring-shaped and exceedingly narrow—the width of the junction is substantially equal to the depth of layer 1, generally less than one micron and typically about one-tenth micron, or even smaller. For example, with a contact button 5 and island 3 having a diameter of 5 mils, and surface layer 1 having a depth of one-tenth micron, the junction area is approximately $4\times10^{-7}$ square centimeters—about $\frac{1}{300}$ the junction area of prior tunnel diodes having a contact of the same size. The result is an almost 300-fold increase in the impedance of the device.

Another important advantage of the present diode over prior tunnel diodes arises from relatively high concentrations of donor or acceptor impurities that can be obtained in thin, surface layers—the impurity concentration in a diffused, surface layer can usually be made about ten times greater than the maximum concentration in a uniformly doped crystal. With the higher impurity concentration, it is possible to realize a higher frequency of oscillation in oscillators comprising the diode, or a greater power gain-band width product in amplifiers.

Figure 3:
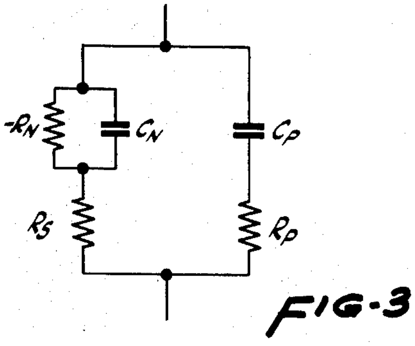
FIG. 3 is a simplified, high-frequency equivalent circuit of the device shown in FIGS. 1 and 2.

FIG. 3 illustrates the high-frequency equivalent circuit of the device shown in FIGS. 1 and 2. $-R_N$ is the negative resistance (due to the tunnel effect) of the junction between island 3 and surface layer 1. $C_N$ is the capacitance of the same junction, and $R_S$ is the resistance in series with the junction through the semiconductor and the two contacts. The high-resistivity region 2 forms a high-impedance shunt across the junction, which conducts a relatively small current compared to the junction current. The resistor $R_P$ represents the resistance of this parallel path through the high-resistivity region, and the capacitor $C_P$ represents the capacitance between region 2 and the adjoining region of opposite conductivity type. For example, if region 2 is of the same conductivity type as surface layer 1 (which is usually the case), then the capacitance $C_P$ appears across the junction between region 2 and island 3. In a typical design this capitance $C_P$ may be about one-tenth as large as the junction capacitance $C_N$. If region 2 is of the same conductivity type as island 3, then the capacitance $C_P$ appears between region 2 and surface layer 1.

The preferred process for fabricating the device shown in FIGS. 1 and 2 is as follows: First, a monocrystalline body of high-resistivity semiconductor is prepared—e.g., lightly doped (nearly intrinsic) n-type silicon. This initial preparation is conventional, like that for the fabrication of diffused-junction transistors, and therefore need not be described here. Surface layer 1 is next formed by diffusing through the surface of the silicon a high concentration of an appropriate impurity—e.g., phosphorus for the formation of an n+ layer or boron for the formation of a p+ layer. Known diffusion techniques may be employed to control the depth of the surface layer, layers as shallow as 0.05 micron being readily obtainable.

The island 3 is formed by placing in contact with the surface a small disc 5 made from an alloy composed of an impurity (of the opposite type to surface layer 1) and a carrier metal that forms a eutectic with the semiconductor at relatively low temperatures. For example, if the semiconductor is silicon and an island of p+ conductivity type is desired, the disc or button 5 may be of an alloy of aluminum and boron. The disc 5 in contact with the semiconductor is now heated above the eutectic point, and a liquidus layer forms between the alloy disc and the semiconductor. As the semiconductor dissolves, this liquidus layer penetrates into the semiconductor body, through the surface layer 1 and into the high-resistivity region 2. The heat is now removed and the structure cools.

As the liquidus layer cools, a regrowth layer of the semiconductor, heavily doped with the impurity from the alloy, forms the island 3, and above this regrowth layer, in ohmic contact therewith, the metal solidifies as an alloy of the semiconductor, the carrier metal, and the impurity. As is well known, the regrowth layer assumes the crystalline form of the underlying monocrystal and becomes substantially a continuous part thereof, whereby an abrupt p-n junction is formed within the crystal between the heavily doped p+ island 3 and the heavily doped n+ layer 1. As a final step, the electrode 4 is attached to the crystal surface by well-known means, e.g., vacuum deposition and photoengraving to remove excess metal.

Figure 4:
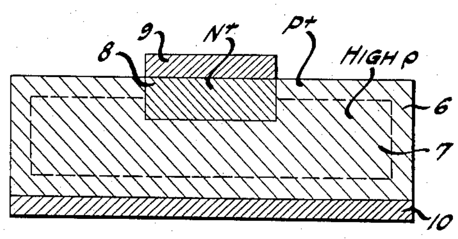
FIG. 4 is a greatly enlarged section, not to exact scale, of another tunnel diode embodying this invention.

FIG. 4 shows another tunnel diode, which differs from that shown in FIGS. 1 and 2 principally in the location of the ohmic contact to the surface layer. In the embodiment shown in FIG. 4, the surface layer 6 (of p+ conductivity type in this instance) completely covers the surface of the semiconductor and encloses the interior high resistivity region 7. (This configuration is the usual result of diffusing an impurity into a body of semiconductor—configurations such as that shown in FIG. 2 are usually obtained by lapping or otherwise removing the surface layer from the back side of the semiconductor body.)

Island 8 of the opposite conductivity type (n+ in this instance) is formed by allowing the metal disc 9 to the semiconductor as hereinbefore explained. It will be noted that island 8 extends through the surface layer 6 into the underlying, high-resistivity region, whereby an abrupt p-n junction is formed around the periphery of the island between the heavily doped island and the heavily doped surface layer 6. This p-n junction has tunnel-diode characteristics. Disc 9 is in ohmic contact with island 8 and forms an electrode to which leads may be attached. Contact to surface layer 6 is made by plating an electrode 10 onto the back side of the semiconductor body. Because of its heavy doping, the surface layer 6 is a good conductor and the series resistance $R_S$ can be made reasonably small with this configuration.

Figure 5:
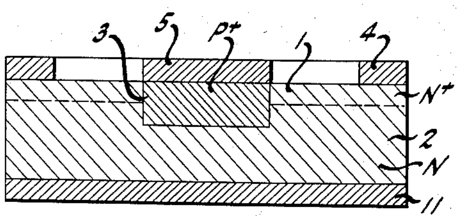
FIG. 5 is a greatly enlarged section, not to exact scale, of a novel, three-terminal semiconductor device containing a p-n junction having tunnel-diode characteristics.

FIG. 5 shows a three-electrode semiconductor device. This device is essentially the same as the diode shown in FIGS. 1 and 2, except that a third electrode 11 has been formed by plating a metal film 11 on the back side of the semiconductor in contact with the high-resistivity region 2 (in this instance a lightly doped, n-type semiconductor). Electrode 11 provides a means for making connection to a tap in the parallel resistance through region 2, so that this resistance may be used as a voltage divider for biasing purposes.

Figure 6:
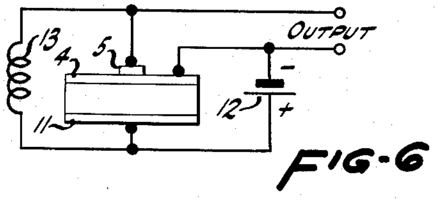
FIG. 6 is a circuit diagram of an oscillator comprising the device shown in FIG. 5.

The novel, three-electrode device thus formed has numerous circuit applications, one of which is the oscillator circuit illustrated in FIG. 6. A voltage supply 12 is connected between electrodes 4 and 11, and an inductor 13 is connected between electrodes 5 and 11, as shown. The circuit will oscillate at a high frequency, and the output can be taken between electrodes 4 and 5.

Figure 7:
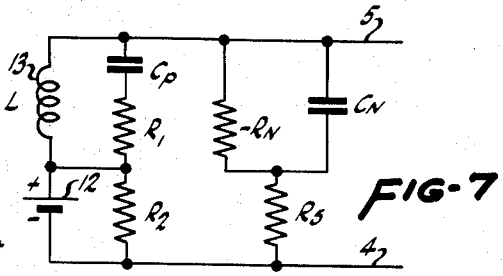
FIG. 7 is a simplified, high-frequency equivalent circuit of the oscillator shown in FIG. 6.

The equivalent circuit of the above oscillator is shown in FIG. 7, wherein $-R_N$ represents the negative resistance of the junction between island 3 and layer 1, which has tunnel-diode characteristics. $C_N$ represents the capacitance of this junction; $R_S$ represents the resistance in series with the tunnel-diode junction between the contacts 4 and 5; $C_P$ represents the capacitance of the junction between island 3 and region 2; $R_1$ represents the resistance through region 2 from its junction with island 3 to contact 11; and $R_2$ represents the resistance through region 2 from contact 11 to the surface layer 1 and contact 4. The conditions for oscillation and the frequency of oscillation can be readily calculated by inserting the appropriate values for the various circuit elements shown in FIG. 7.

Figure 8:
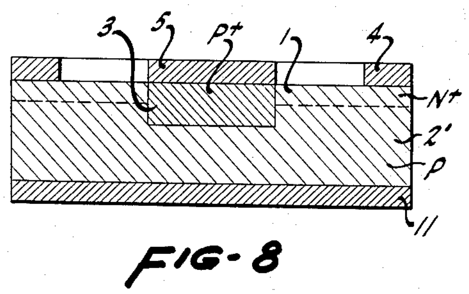
FIG. 8 is a greatly enlarged section, not to exact scale, of another novel, three-terminal semiconductor device containing a p-n junction having tunnel-diode characteristics.

FIG. 8 shows a modification of the three-conductor device, and may be identical to the device shown in FIG. 5 except that in FIG. 8 the high-resistivity region 2′ is of the same conductivity type as the island 3, but of course is much less heavily doped. In this instance the capacitance $C_P$ appears at the junction between region 2′ and surface layer 1, and generally will be considerably larger than in the other embodiment because of the relatively large size of this junction.

A decrease in the shunt capacitance $C_P$ may be desired in some instances, particularly in the three-terminal structures where the resistance of $R_2$ (see FIG. 7) must be made small to obtain oscillation. The structure illustrated in FIG. 9 permits a reduction in $C_P$ by a factor of four or more.

Figure 9:
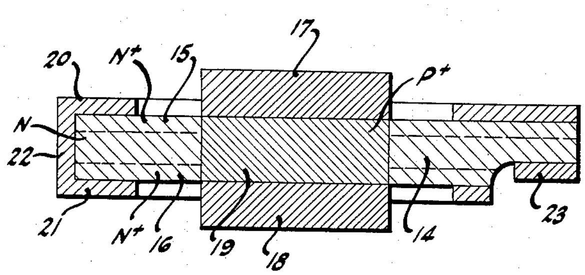
FIG. 9 is a greatly enlarged section, not to exact scale, of still another novel, tunnel-effect, semiconductor device.

Referring to FIG. 9, a thin, monocrystalline wafer (say two mils thick) of lightly doped, high resistivity, n-type silicon 14 is provided (e.g., by the diffusion of an impurity through its top and bottom surfaces) with two heavily doped, n+ type, surface layers 15 and 16. An aluminum-boron alloy disc 17 in contact with one face of the wafer, and, if desired, another aluminum-boron alloy disc 18 in contact with the opposite face, are heated until the alloyed junction penetrates the wafer, forming a p+ region 19 which extends entirely through the wafer 14, as shown. This structure has two annular p-n junctions with tunnel-diode characteristics: one between region 19 and surface layer 15, and another between region 19 and surface layer 16.

Discs 17 and 18 are both in ohmic contact with region 19, and either may be used as one electrical terminal. Ohmic contact to layers 15 and 16 can be made through metal-film electrodes 20 and 21 deposited upon the two faces of the crystal. By extending the metal film over one edge of the crystal, as shown at 22, the two tunnel-diode junctions are connected in parallel. Contact to the high-resistivity region, if desired, can be made by removing—e.g., by etching—the surface layer from a portion of the crystal and applying a metal-film electrode to the exposed high-resistivity region, as illustrated at 23.

It will be understood that this invention is not limited to specific examples illustrated and described, and that the scope of the invention is defined by the following claims.

What is claimed is:

1. A semiconductor device comprising a body of semiconductor containing four regions, three of said regions being of the same conductivity type and arranged in layers, one atop the next, the middle of said three regions being of substantially higher resistivity than the two surface regions, and a fourth region of the opposite conductivity type forming PN junctions with each of said three regions, the junctions with said surface regions having tunnel-diode characteristics.

2. A semiconductor device comprising a body of semiconductor containing four regions, three of said regions being of the same conductivity type and arranged in layers, one atop the next, the middle of said three regions being N-type and the surface regions being N+ type, and a fourth region of the P-type forming PN junctions with each of said three regions, the junctions with said surface regions having tunnel-diode characteristics.

3. A semiconductor device comprising a body of semiconductor containing four regions, three of said regions being of the same conductivity type and arranged in layers, one atop the next, the middle of said three regions being N-type and the outer two regions being N+ type, and contacts to each of the outer of said three regions, said contacts being a metal which is alloyed with said outer regions to penetrate through said body of semiconductor to form a fourth region therein of P-type conductivity, said fourth region forming PN junctions with each of said three regions, and junctions with said outer regions having tunnel-diode characteristics.

References Cited in the file of this patent

UNITED STATES PATENTS

| | | |
|---|---|---|
| 2,868,683 | Jochems et al. | Jan. 13, 1959 |
| 2,900,286 | Goldstein | Aug. 18, 1959 |
| 2,931,958 | Arthur et al. | Apr. 5, 1960 |
| 2,937,114 | Shockley | May 17, 1960 |
| 2,937,324 | Kroko | May 17, 1960 |
| 2,937,960 | Pankove | May 24, 1960 |
| 2,954,307 | Shockley | Sept. 27, 1960 |
| 3,079,512 | Rutz | Feb. 26, 1963 |